United States Patent
Wang

(10) Patent No.: US 8,922,292 B2
(45) Date of Patent: Dec. 30, 2014

(54) DEVICE AND METHOD FOR COMPENSATING IMPEDANCE AND GAIN OF TRANSMISSON INTERFACE

(75) Inventor: Wen-Shan Wang, HsinChu (TW)

(73) Assignee: Realtek Semiconductor Corp., Hsinchu (TW)

( * ) Notice: Subject to any disclaimer, the term of this patent is extended or adjusted under 35 U.S.C. 154(b) by 398 days.

(21) Appl. No.: 13/370,824

(22) Filed: Feb. 10, 2012

(65) Prior Publication Data

US 2012/0206214 A1 Aug. 16, 2012

(30) Foreign Application Priority Data

Feb. 11, 2011 (TW) ............................... 100104653 U

(51) Int. Cl.
| H03H 7/38 | (2006.01) |
| H04L 1/00 | (2006.01) |
| H04L 25/02 | (2006.01) |
| H04L 25/03 | (2006.01) |
| H04L 7/00 | (2006.01) |

(52) U.S. Cl.
CPC ............... *H04L 1/0057* (2013.01); *H03H 7/38* (2013.01); *H04L 25/0278* (2013.01); *H04L 25/03885* (2013.01); *H04L 7/0087* (2013.01)
USPC ........................................ 333/17.3; 333/28 R

(58) Field of Classification Search
USPC .................................... 333/28 R, 33, 32, 17.3
See application file for complete search history.

(56) References Cited

U.S. PATENT DOCUMENTS

| 8,054,876 B2 * | 11/2011 | Tsai .............................. 375/233 |
| 2005/0052255 A1 | 3/2005 | Chiang |
| 2005/0141601 A1 | 6/2005 | Renaud et al. |

* cited by examiner

*Primary Examiner* — Stephen Jones
(74) *Attorney, Agent, or Firm* — Muncy, Geissler, Olds & Lowe, P.C.

(57) ABSTRACT

A device for compensating impedance and gain of a transmission interface is provided. The device includes a correcting and compensating unit, a clock data recovery unit, a decoder, a calculating unit, and an adaptive control unit. The correcting and compensating unit is used to receive a channel signal, and compensate the channel signal according to a control signal to generate a compensation signal. The clock data recovering unit is used to receive the compensation signal and generate a data signal. The decoder is used to decode the data signal and perform detection to generate error information and correct information. The calculating unit is used to count times of generating the error information and times of generating the correct information to accordingly generate reference data. The adaptive control unit is used to receive the reference data and perform calculation to generate the control signal.

20 Claims, 7 Drawing Sheets

DEVICE AND METHOD FOR COMPENSATING IMPEDANCE AND GAIN OF TRANSMISSON INTERFACE

CROSS-REFERENCES TO RELATED APPLICATIONS

This non-provisional application claims priority under 35 U.S.C. §119(a) on Patent Application No. 100104653 filed in Taiwan, R.O.C. on 2011 Feb. 11, the entire contents of which are hereby incorporated by reference.

BACKGROUND

1. Technical Field

The disclosure relates to a receiver, and more particularly to a device and a method for compensating the impedance and gain of a transmission interface.

2. Related Art

In a communication system of a Personal Computer (PC), a bus therein adopts parallel transmission to accelerate a transmission speed in the part. With the high-speed evolution of a PC micro-processor, bandwidth demands of a memory and a peripheral Input/Output (I/O) are also increased. A transmission interface in the conventional PC, for example Peripheral Component Interconnection (PCI) or Advanced Technology Attachment (ATA), transmits data in a parallel manner, so the speed of the transmission interface cannot meet future demands of increased data. If the parallel manner is still adopted during interface design, and only parallel signal lines are increased, not only does a Printed Circuit Board (PCB) layout become complicated, but the difference between a clock signal and transmitted data becomes more serious. Therefore, during subsequent development, an interface based on serial transmission is used to solve the bandwidth demand, leading to the prompt development of PCI express or serial ATA. For transmission from a data peripheral to the PC, Universal Serial Bus (USB) devices have been developed, and the USB device has nearly replaced the externally connected transmission interface (for example, Print Port), demonstrating that the current trend is to design fast data transmission techniques, while reducing connection lines.

Please refer to FIG. 1, which shows the data transmission architecture of a common communication system 300. A receiver 250 includes a correcting impedance 130, an equalizer 140, a clock data recovering unit 160, a decoder 170, and a micro-control unit 180. Usually, channel data is transmitted by using a two-bit signal, in the two-bit signal, a high (positive), level represents data "1", and a low (negative), level represents data "0". When transmitter 110 transfers a series of transmitting signal VX, the two-bit signal could be interfered by the channel 120 (for example, a wired transmission line) so that the channel signal VR received by the equalizer 140 is distorted. The interference feature of the channel 120 is like a low-pass filter, a high frequency component of the transmitting signal VX is attenuated due to the effects of the channel 120. There are many factors may cause signal distortion, for example, interactive symbol interference, reflection interference, noise interference, and crosstalk interference, etc. Interference of channel 120 may result the transmitting signal VX distortion, in other words, the channel signal VR received by receiver 250 is a distorted transmitting signal VX. Therefore, if the high frequency component of the transmitting signal VX is seriously interfered, the channel signal VR must be sent to the equalizer 140 to perform high frequency compensation and correspondingly generate the compensation signal X.

The reflection interference and the impedance matching of the channel 120 are related. Signal is transmitted in the channel 120, the impedance value of the channel 120 easily generates impedance mismatching since joint points of cable lines or joint impedances are not uniform, and the impedance mismatching may result in signal reflection, causing signal distortion. Generally, equivalent impedance on the coaxial cable is 50Ω, but with the different cable lines and the different wiring of the circuit boards, the correcting impedance 130 is usually added at a receiving end of the bus. A purpose of adjusting the impedance value of the correcting impedance 130 is to achieve the impedance matching with the impedance value of the channel 120 so as to avoid the signal reflection.

In the market, the impedance value of the high-speed transmission interface is defined, so that the designer may design the similar impedance value in advance, thus achieving the effect of impedance matching to reduce the reflection wave, and reducing noise. However, most of transmission interface designs on the market only consider manufacture variation, voltage variation, and temperature variation, but fail to consider the possible influences of the circuit board.

The prior art may have several problems as listed in the following paragraphs.

1. Due to the mismatch of the impedance value of the channel 120 and the impedance value of the receiver 250, the input end of receiver 250 will generate reflection signal to influence the channel signal VR when transmitting signal VX passing through channel 120. In prior art, it is only possible to estimate the impedance value of the channel 120, and preset the impedance value of the correcting impedance 130. However, the impedance mismatching results from the connection lines or the wire winding of the circuit board could also distort the channel signal VR.

2. The interference feature of the channel 120 is like a low-pass filter, the high frequency component of the transmitting signal VX is attenuated due to the effects of the channel 120. In prior art, when different kind of interferences occur, the channel signal VR received by receiver 250 could under compensation or over compensation due to equalizer 140 only has a compensation parameter for channel effect. There were no suitable skills and techniques to the equalizer 140 in prior art.

In order to solve the problem that the prior art fails to adjust the impedance value of the correcting impedance 130 and the compensation parameter of the equalizer 140 to obtain a distortion-free compensation signal X, it is necessary to provide a new architecture to achieve the impedance matching or adjust the compensation parameter suitably to compensate the distortion of the channel signal VR.

SUMMARY

The disclosure is directed to a device for compensating impedance and gain of a transmission interface. The device for compensating the impedance and the gain of the transmission interface includes a correcting and compensating unit, a clock data recovering unit, a decoder, a calculating unit, and an adaptive control unit. The correcting and compensating unit, coupled to a channel, is used to receive a channel signal, and correct and compensate the channel signal to generate a compensation signal according to a control signal. The clock data recovering unit is coupled to the correcting and compensating unit, and used to receive the compensation signal and generate a data signal. The decoder is coupled to the clock data recovering unit, and used to decode the data signal and perform detection to generate error information and correct information. The calculating unit is coupled to the clock data recovering unit and the decoder, and used to count times of generating the error information and times of generating the correct information to accordingly generate reference data. The adaptive control unit is coupled to the correcting and compensating unit, and used to receive the reference data and perform calculation to generate the control signal.

The disclosure is also directed to a method for compensating impedance and gain of a transmission interface. The method includes: inputting a channel signal to a correcting and compensating unit, and compensating the channel signal according to a control signal, so as to output a compensation signal; processing the compensation signal to generate a data signal; decoding and detecting the data signal, in order to generate error information and correct information; counting and calculating times of generating the error information and times of generating the correct information, in order to accordingly generate reference data; and performing calculation according to the reference data, so as to generate the control signal.

In order to make these and other objectives, features and advantages of the disclosure comprehensible, preferred embodiments accompanied with figures are described in detail in the following pages.

DETAILED DESCRIPTION

In view of problems of the prior art, in the disclosure, an calculating unit generates reference data, then an adaptive control unit performs calculation on the reference data to obtain optimal impedance and an equalized compensation parameter, thereby achieving impedance matching or adjusting the compensation parameter suitably to compensate the distortion of a channel signal.

Figure 1:
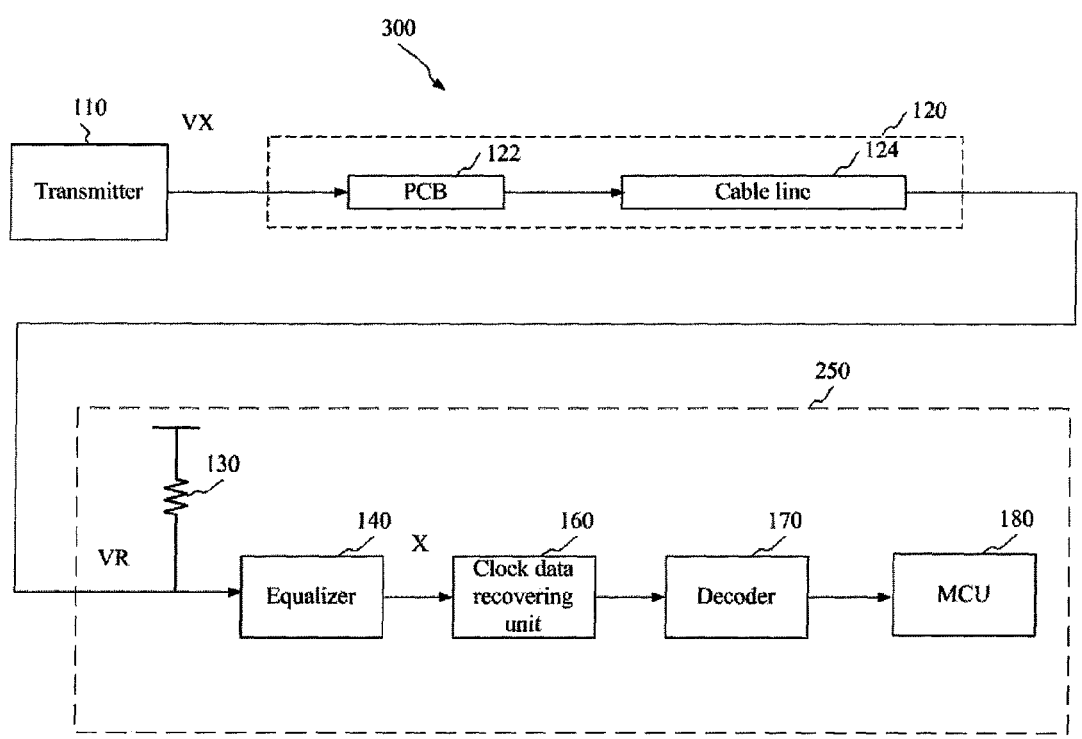
FIG. 1 shows a data transmission architecture of a communication system (prior art)
Figure 2:
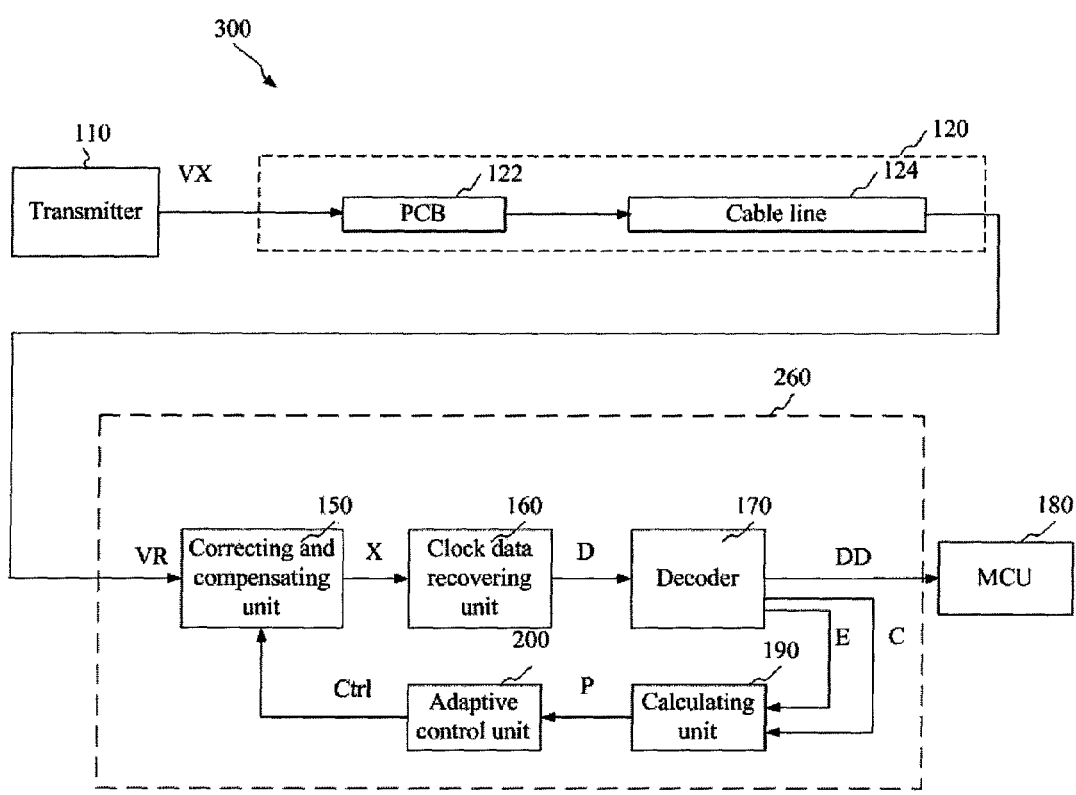
FIG. 2 shows an embodiment of a device for compensating impedance and gain of a transmission interface.

Please refer to FIG. 2, which shows an embodiment of a device for compensating impedance and gain of a transmission interface. The correcting and compensating device of receiver 260—in a communication system 300 includes a correcting and compensating unit 150, a clock data recovering unit 160, a decoder 170, a calculating unit 190, and an adaptive control unit 200. The correcting and compensating unit 150 is coupled to a channel 120 and used to receive a channel signal VR. According to a control signal Ctrl, the correcting and compensating unit 150 corrects and compensates the channel signal VR into a compensation signal X. The clock data recovering unit 160 is coupled to the correcting and compensating unit 150, and used to receive the compensation signal X and generate a data signal D. The decoder 170 is coupled to the clock data recovering unit 160, and used to decode the data signal D and perform detection, so as to generate error information E, correct information C, and decoding data DD. The calculating unit 190 is coupled to the decoder 170, and used to calculate times of generating the error information E and times of generating the correct information C to generate reference data P. The adaptive control unit 200 is coupled to the calculating unit 190, and used to receive the reference data P and perform calculation to generate the control signal Ctrl.

Figure 3:
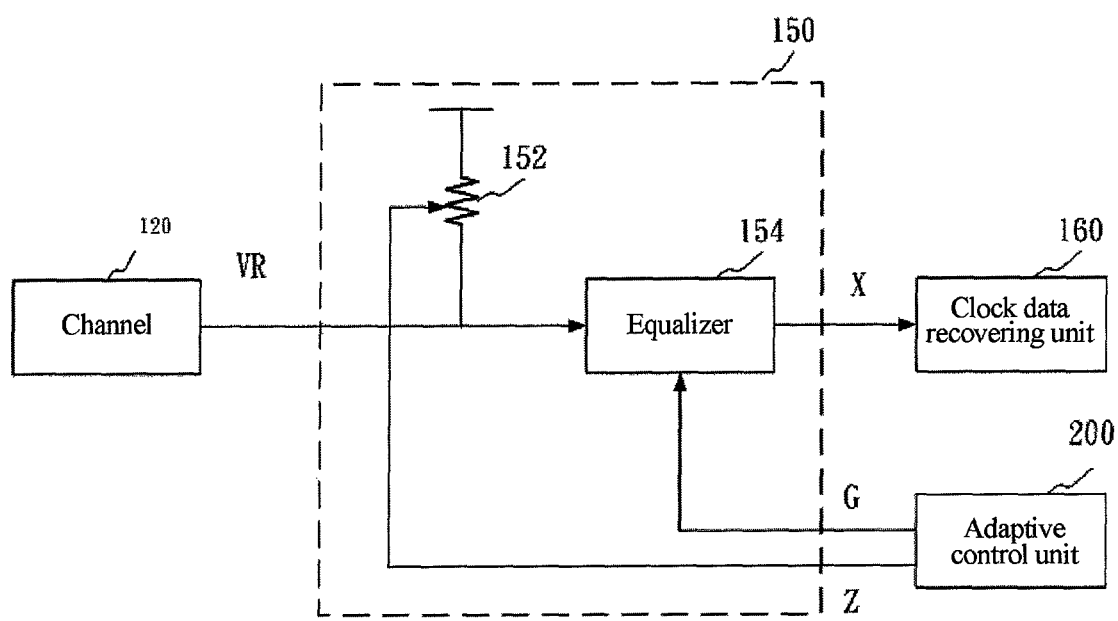
FIG. 3 shows a first embodiment of detailed function blocks of a correcting and compensating unit.

Next, please refer to FIG. 3, which shows a detailed function block diagram of—the correcting and compensating unit 150 according to a first embodiment of the disclosure.

The correcting and compensating unit 150 receives the control signal Ctrl, and the control signal Ctrl includes a first control signal Z and a second control signal G. The correcting and compensating unit 150 includes a correcting impedance 152 and an equalizer 154. The correcting impedance 152 is coupled to the channel 120 and the adaptive control unit 200. The impedance value of the correcting impedance 152 is adjusted according to the first control signal Z, so as to match with the impedance value of the channel 120, and reduce reflection distortion. The equalizer 154 is coupled to the channel 120 and the adaptive control unit 200, and used to receive the channel signal VR. The equalizer 154 also compensates the channel signal VR according to the second control signal G, so as to generate the compensation signal X.

In the disclosure, the correcting impedance 152 in the correcting and compensating unit 150 is used to reduce the reflection resulted from impedance mismatching. In order to compensate high frequency distortion, the equalizer 154 in the correcting and compensating unit 150 is necessary to compensate the channel signal VR and generate the compensation signal X, so as to provide the compensation signal X to the backend clock data recovering unit 160 for further determination.

In order to achieve the high speed requirement, the signal transferred from the transmitter 110 to the correcting and compensating device of receiver 260 only includes data with implicit clock data rather than actual clock signal. The correcting and compensating device of receiver 260 needs to decode data content and the frequency of the clock signal from the received channel signal VR when the clock signal does not exist. Therefore, after the channel signal VR is processed by the equalizer 154, the clock data recovering unit 160 finds a clock sampling signal CLK according to the compensation signal X output by the equalizer 154, and resample the channel signal VR output by the equalizer 154 based on the clock sampling signal CLK, so as to obtain the data signal D. The clock data recovering unit 160 further includes a low-pass filter, which filters high frequency noises from the obtained clock sampling signal CLK, so that the data output during such clock sampling has smaller jitter than the non-sampled data.

After processed by the clock data recovering unit 160, the correcting and compensating device of receiver 260 further includes an 8b/10b decoder 170. The decoding data DD processed by the decoder 170 is sent to a micro-control unit 180 for further processing. Therefore, the transferring data in the transmitter 110 firstly needs to pass through the encoder (8b/10b-encoder), namely, encoding 8 bit transferring data into 10 bit transferring data. Next, the encoded data are transferred to the channel 120. The channel signal VR generated by channel interference is compensated into the compensation signal X by the correcting and compensating unit 150, and then the clock data recovering unit 160 generates the data signal D. Here, by using four groups of mapping values in a look-up table, the decoder 170 in the receiver 250 compares and detects whether the data signal D has the four groups of mapping values. If a mapping relation exists, the decoder 170 maps and obtains one of the four groups to decode the transferring data as the same as the original transferring data, which represents that the encoded transfer data is not interfered by distortion of the channel 120 when being transmitted therethrough. As a result, the decoder 170 in the correcting and compensating device of receiver 260 is able to output error-free correct information C and decoding data DD, send the decoder 170 transfers the decoding data DD to the microcontrol unit, and send the correct information C to the calculating unit 190. When the mapping relation does not exist, the decoder 170 cannot map and obtain the transferring data as the same as the original transferring data, which represents that the transfer data is seriously interfered by the channel 120 when being transmitted there through, so that the error information E is obtained and sent to the calculating unit 190.

The calculating unit 190 performs calculation based on the times of generating the error information E and the times of generating the correct information C. The data signal D is converted to parallel data B(n) (not shown), through serial conversion in the decoder 170, n represents the parallel data B of an $n^{th}$ time, for example, B(5) is converted parallel data B of a $5^{th}$ time. N represents a total amount of the parallel data B, for example, N=100 represents that totally 100 batches of parallel data B exist and is decoded by the decoder 170 into the error information E, the correct information C, and the decoding data DD. E(n) represents the error information E of the $n^{th}$ time, and C(n) represents the correct information C of the $n^{th}$ time. For example, when n=1, it represents that the parallel data B of the $1^{st}$ time cannot find the correct decoding, so that E(1)=1, and C(1)=0; on the contrary, when the parallel data B of the $1^{st}$ time finds the correct decoding, E(1)=0, and C(1)=1. Reference data P(m) represents an calculation result of the reference data of an $m^{th}$ time.

The following is a calculation formula.

$$P(m) = \sum_{n=1}^{N} E(n) \qquad \text{Formula 1}$$

$$P(m) = \sum_{n=1}^{N} \frac{E(n)}{E(n)+C(n)} * 100\% \qquad \text{Formula 2}$$

The reference data P(m) is the accumulated times of generating the error information E, or the accumulated times of generating the error information E divided by a sum of the accumulated times of generating the error information E and the correct information C in a percentage form. N represents the times of generating the parallel data B, and N may be one or more times.

In the following descriptions, two examples are respectively listed.

EXAMPLE #1

N=5 represents that total five batches of parallel data B exist, and are decoded by the decoder 170 as the error information E, the correct information C, and the decoding data DD. E(n) represents the error information E of the $n^{th}$ time, and C(n) represents the correct information C of the $n^{th}$ time. When n=1, it represents that the parallel data B of the $1^{st}$ time cannot find the correct decoding, so that E(1)=1, and C(1)=0. When n=2, it represents that the parallel data B of the $2^{nd}$ time cannot find the correct decoding, so that E(2)=1, and C(2)=0. Next, the remaining parallel data B are decoded by the decoder 170 to obtain E(3)=0, E(4)=0, and E(5)=0, and C(3)=1, C(4)=1, and C(5)=1. Therefore, the calculating unit 190 performs calculation through Formula 1 by summing up E(1)=1, E(2)=1, E(3)=0, E(4)=0, and E(5)=0, and then obtain the reference data P(1)=2 of the $1^{st}$ time, and send to the adaptive control unit 200.

EXAMPLE #2

N=5 represents that total five batches of parallel data B exist, and are decoded by the decoder 170 as the error information E, the correct information C, and the decoding data DD. E(n) represents the error information E of the $n^{th}$ time, and C(n) represents the correct information C of the $n^{th}$ time. When n=1, it represents that the parallel data B of the $1^{st}$ time cannot find the correct decoding, so that E(1)=1, and C(1)=0. When n=2, it represents that the parallel data B of the $2^{nd}$ time cannot find the correct decoding, so that E(2)=1, and C(2)=0. Next, the remaining parallel data B is decoded by the decoder 170 to obtain E(3)=0, E(4)=0, and E(5)=0, and C(3)=1, C(4)=1, and C(5)=1. Therefore, the calculating unit 190 performs calculation through Formula 2, and then obtain that the reference data P(1) at the $1^{st}$ time m=1 is ⅖, which equals to 0.4*100%=40%, and send to the adaptive control unit 200.

In the following descriptions, two embodiments of the algorithms of the adaptive control unit 200 according to the reference data are listed.

The first algorithm is a table look-up method, in which the adaptive control unit 200 includes a memory space to store a look-up table. The adaptive control unit 200 searches for numerical values in the look-up table according to the reference data P by using the table look-up method to generate the first control signal Z, and adjusts the impedance value of the correcting impedance 152 according to the first control signal Z, so as to match with the impedance value of the channel 120, thereby reducing the reflection and lowering the interference of the channel signal VR. The second control signal G is also generated by searching for the numerical values in the look-up table according to the reference data P, and the compensation parameter of the equalizer 154 is adjusted according to the second control signal G, so as to compensate the distortion of the channel signal VR and generate the compensation signal X. The calculation of P may use Formula 1 or Formula 2, and the amount of N may be adjusted, the amount of N is the result of using one or more times of E or C, that is, n=5 represents that 5 times of error information E and 5 times of correct information C are used. The second algorithm is an adaptive adjusting manner, in which the reference data P is differentiated into the first reference data P(m) and the second reference data P(m−1). The first reference data P(m) represents a calculation result obtained currently by using C(n) and E(n) according to Formula 1, and the second reference data P(m−1) represents a calculation result obtained previously by using C(n−1) and E(n−1) according to Formula 1. The adaptive control unit 200 generates the first control signal Z and the second control signal G according to the first reference data P(m) and the second reference data P(m−1) by using the adaptive adjusting manner, so as to respectively adjust the impedance value of the correcting impedance 152 and the compensation parameter of the equalizer 154. The calculation of P may selectively use Formula 1 or Formula 2, and the amount of N may be adjusted, the amount of N is the result of using one or more times of the error information E or the correct information C. The impedance step value Step_Z and the gain step value Step_G are respectively a preset value, for example, 2 or 5. The direction symbol Sign includes the impedance symbol Sign_Z and the gain symbol Sign_G. The calculation times m represents the $m^{th}$ calculation using Formula 1 or Formula 2.

Figure 4:
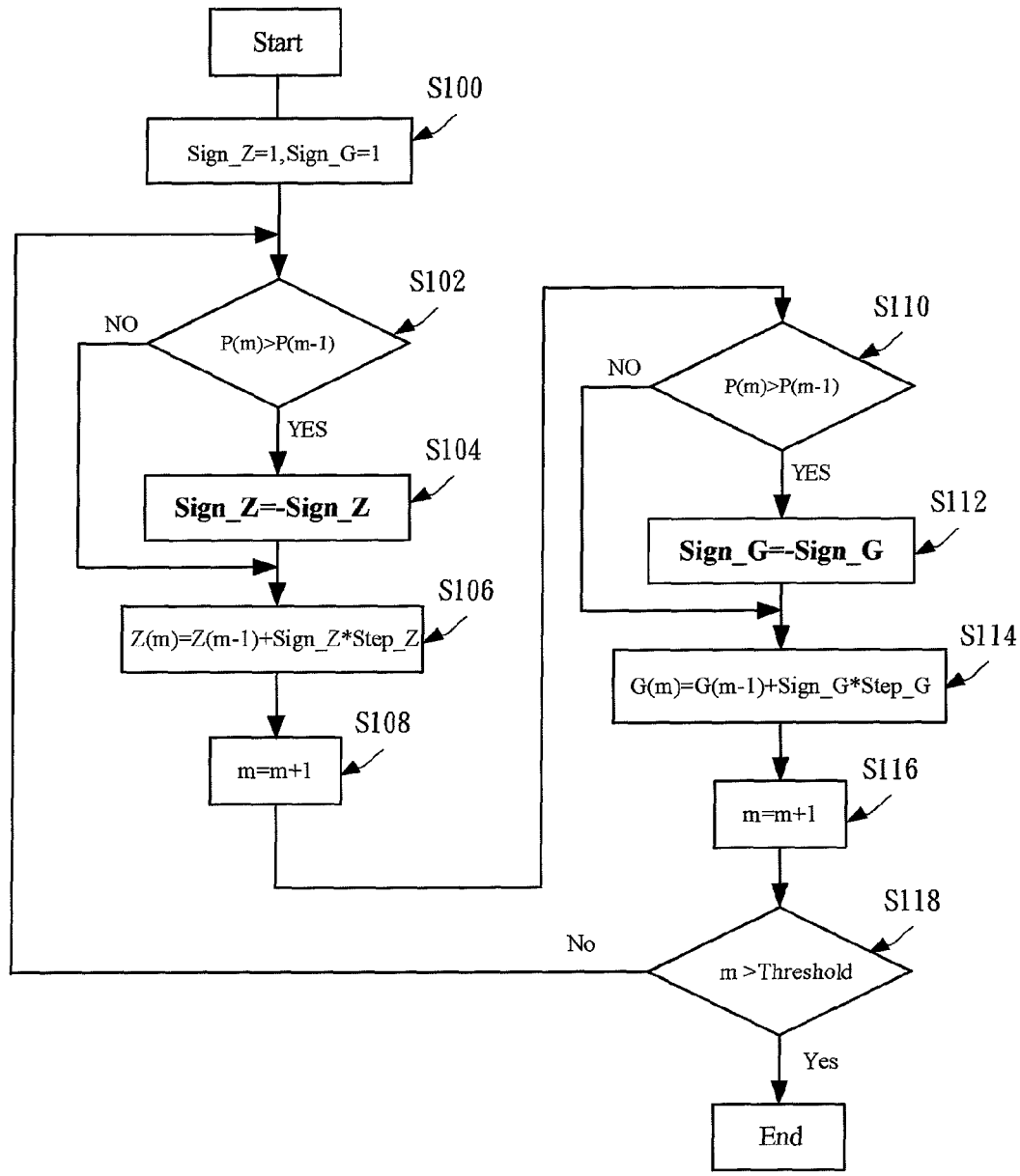
FIG. 4 is a flow chart of a first embodiment of an adaptive adjusting manner.

Please refer to FIG. 4, which is a flow chart of a first embodiment based on the adaptive adjusting manner, including the following steps.

Step 100: "Sign_Z=1, Sign_G=1". The impedance symbol Sign_Z may be set as 1, and the gain symbol Sign_G may also be set as 1.

Step 102: "if(P(m)>P(m−1))". P(m) is the calculation result obtained currently through Formula 1 or Formula 2, and P(m−1) is the previous calculation result obtained previously by using Formula 1 or Formula 2. When the first reference data P(m) is greater than the second reference data P(m−1), it represents that P(m) has a greater amount of error information E in comparison with P(m−1), step 104 is further executed, and when the first reference data P(m) is smaller than or equal to the second reference data P(m−1), step 106 is executed.

Step 104: "Sign_Z=−Sign_Z". The impedance symbol being 1 represents a positive value, and impedance symbol being −1 represents a negative value, so here the impedance symbol is inverted. Namely, if the positive value of the impedance symbol is changed to the negative value, or the negative value is changed to the positive value, step 106 is further executed.

Step 106: "Z(m)=Z(m−1)+Sign_Z*Step_Z". Z(m) represents an impedance adjusting parameter, that is, the first control signal. The first control signal Z(m) is obtained by summing up of the first control signal Z(m−1) and the impedance symbol Sign_Z multiplied with by the impedance step value Step_Z. After the first control signal Z(m) is sent to the correcting impedance 152 to adjust the impedance value of the correcting impedance 152, step 108 is further performed.

Step 108: "m=m+1". After the impedance value of the correcting impedance 152 is adjusted, calculation is performed again according to Formula 1 or Formula 2 to obtain P(m).

Step 110: "if(P(m)>P(m−1))". When the first reference data P(m) is greater than the second reference data P(m−1), it represents that the current reference data P(m) has a greater amount of error information E in comparison with the previous reference data P(m−1), step 112 is performed; when the first reference data is smaller than or equal to the second reference data P(m−1), step 114 is further executed.

Step 112: "Sign_G=−Sign_G". The gain symbol 1 represents a positive value, and the gain symbol being −1 represents a negative value, so here the gain symbol is inverted. Namely, if the positive value of the gain symbol is changed to the negative value, or the negative value is changed to the positive value, step 114 is further executed.

Step 114: "G(m)=G(m−1)+Sign_G*Step_G". G(m) represents a gain adjusting parameter, that is, the second control signal. The second control signal G(m) equals to a sum of the previous second control signal G(m−1) and the gain symbol Sign_G multiplies with the gain step value Step_G; if the second control signal G(m) is sent to the equalizer 154 to adjust a filter compensation parameter of the equalizer 154 to compensate the distorted channel signal VR, and then step 116 is further performed.

Step 116: "m=m+1". After the filter compensation parameter of the equalizer 154 is adjusted, step 118 is further performed.

Calculation may be performed again according to Formula 1 or Formula 2 to obtain P(m).

Step 118: "m>threshold". When m is greater than a threshold, the adaptive adjusting manner is abandoned, otherwise, the procedure further returns to step 102. Selection and setting of the threshold depend on practical applications of the system. Therefore, as long as m is smaller than or equal to the threshold, the procedure repeatedly returns to step 102 to execute the adaptive adjusting manner, until m is greater than the threshold, and then the adaptive adjusting manner is abandoned.

Figure 5:
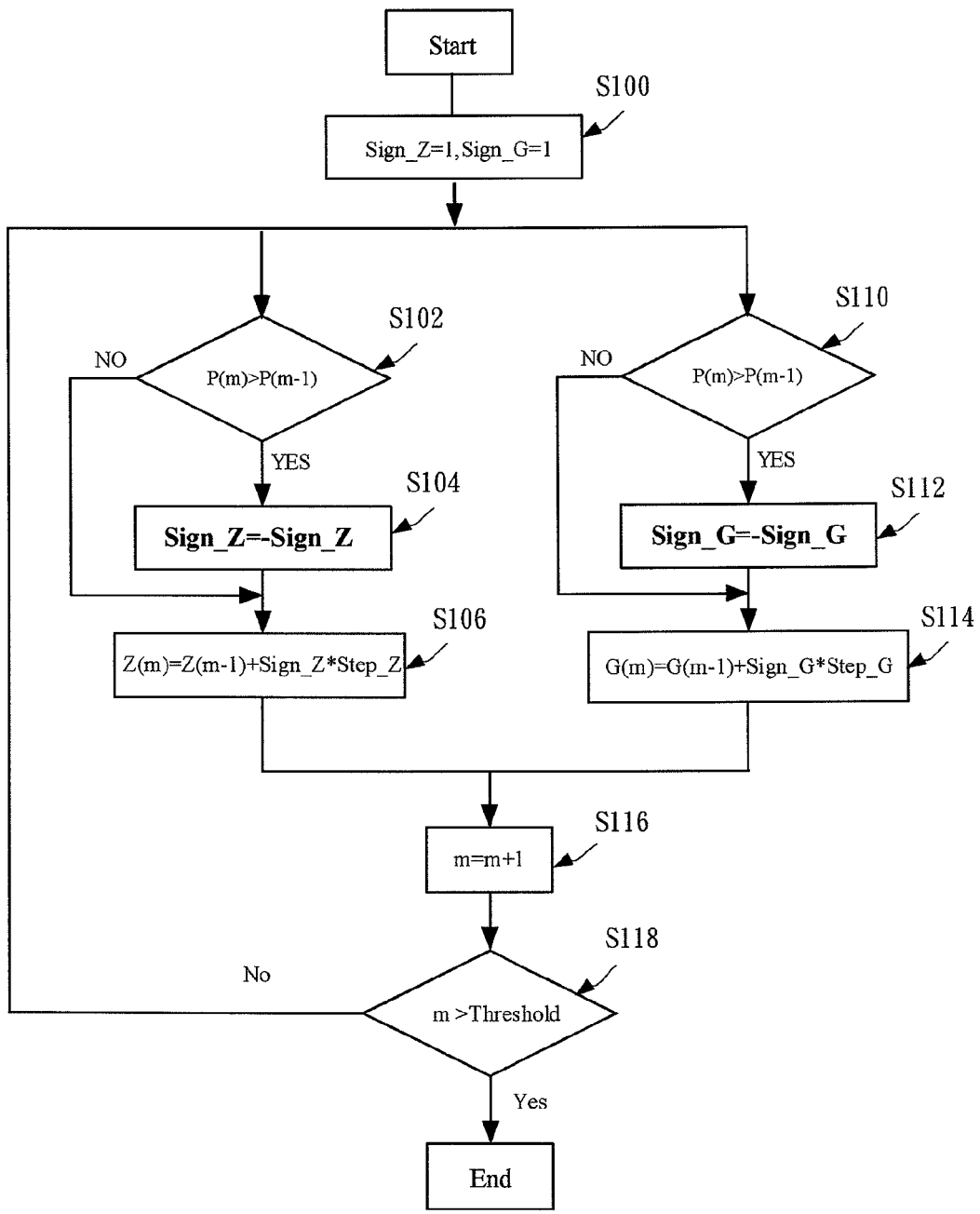
FIG. 5 is a flow chart of a second embodiment of an adaptive adjusting manner.

Please refer to FIG. 5, which is a flow chart of a second embodiment based on the adaptive adjusting manner. In FIG. 4, after the first control signal Z(m) is adjusted, the m=m+1 time is calculated again according to Formula 1 or Formula 2, and after current P(m) is obtained, P(m) is compared with P(m−1) to obtain the second control signal G(m). However, in FIG. 5, the first control signal Z(m) and the second control signal G(m) are adjusted at the same time, then the m=m+1 time is calculated again according to Formula 1 or Formula 2, until m is greater than the threshold. If m is greater than the threshold, the adaptive adjusting manner is abandoned; otherwise, the procedure returns to step 102.

It should be noted that the two algorithms of the adaptive control unit use the adaptive adjusting manner and the table look up manner, in which the calculation times of the adaptive adjusting manner is not limited, but the times of m is determined according to a threshold value. Furthermore, in addition to adjusting the impedance matching and the compensating element of the channel signal VR when activating the system, even under normal operation of the system, when the channel 120 is interfered by the high frequency and causes the serious distortion of the channel signal VR, the architecture of the disclosure may be used to correct the impedance and compensate the distorted channel signal VR.

Figure 6:
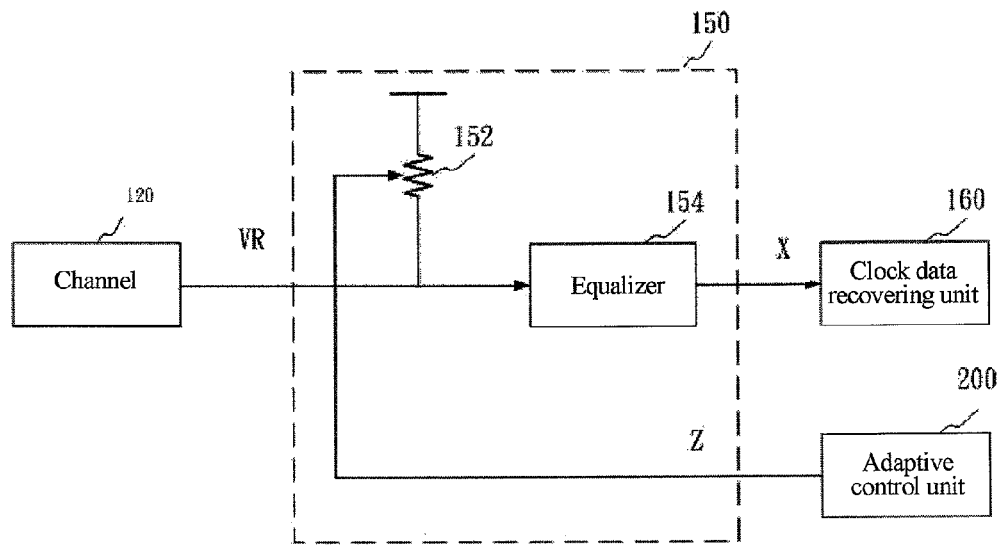
FIG. 6 shows a second embodiment of detailed function blocks of a correcting and compensating unit.

Please refer to FIG. 6, which shows a of detailed function block diagram of the correcting and compensating unit according to a second embodiment. The difference between FIG. 6 and FIG. 3 is that the correcting and compensating unit of FIG. 3 can adjust the impedance value of the correcting impedance 152 and the compensating effect of the equalizer 154. In FIG. 6, the compensating effect of the equalizer 154 is fixed, and only the impedance value of the correcting impedance 152 is adjusted. The correcting and compensating unit 150 includes a correcting impedance 152 and an equalizer 154. The correcting impedance 152 is coupled to the channel 120 and the adaptive control unit 200, in which an impedance value of the correcting impedance 152 is used to match with the impedance value of the channel 120 according to the control signal and reduce the reflection distortion accordingly. The equalizer 154 is coupled to the channel 120, and used to receive the channel signal XR, and compensate the channel signal XR, so as to output the compensation signal X.

Figure 7:
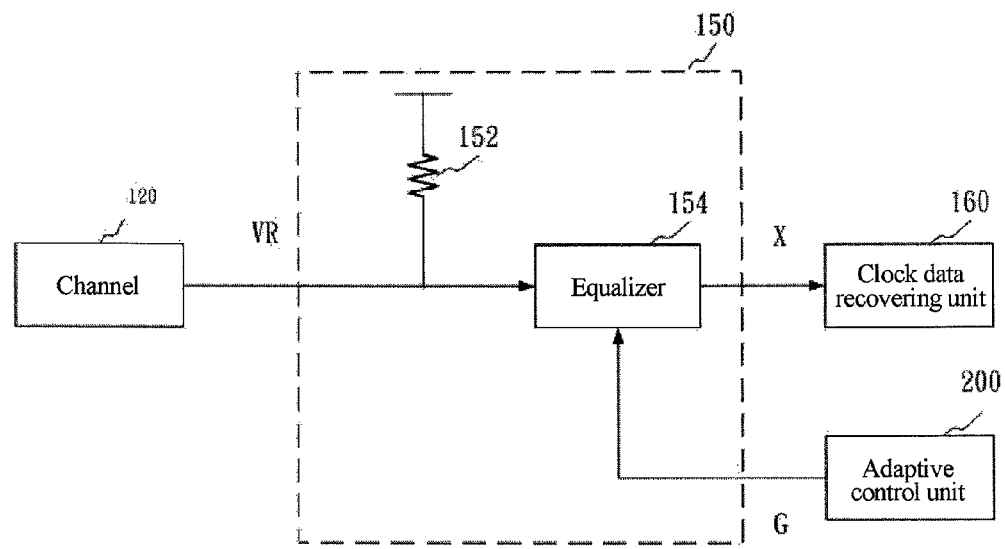
FIG. 7 shows a third embodiment of detailed function blocks of a correcting and compensating unit.

Please refer to FIG. 7, which shows a detailed function block diagram of the correcting and compensating unit according to a third embodiment. The difference between FIG. 7 and FIG. 3 is that the correcting and compensating unit of FIG. 3 can adjust the impedance value of the correcting impedance 152 and the compensating effect of the equalizer 154. In FIG. 7, the impedance value of the correcting impedance 152 is fixed and only the compensating effect of the equalizer 154 is adjusted. The correcting and compensating unit 150 includes a correcting impedance 152 and an equalizer 154. The correcting impedance 152 is coupled to the channel 120, and is used to preset an impedance value of the correcting impedance 152 to match with the impedance value of the channel 120, so as to reduce the reflection distortion. The equalizer 154 is coupled to the channel 120 and the adaptive control unit 200, and used to receive the channel signal XR, adjust the compensation parameter of the equalizer 154 according to the control signal, and compensate the channel signal XR, so as to output the compensation signal X.

In the embodiments of FIG. 6 and FIG. 7, the adaptive control unit 200 respectively controls the correcting impedance 152 and the equalizer 154. Here, the control signals generated by the adaptive control unit 200 may be different; wherein the first control signal Z is used to control the correcting impedance 152 and the second control signal G is used to control the equalizer 154. The manner of generating the first control signal Z and the second control signal G may be realized by the calculation manners described above, and is not repeatedly described in the following.

It should be noted that the parameters and the numerical values of the formulas and the conditions described above are not particularly limited, in which the selection of the parameters and the setting of the numerical values depend on the practical applications of the system.

Figure 8:
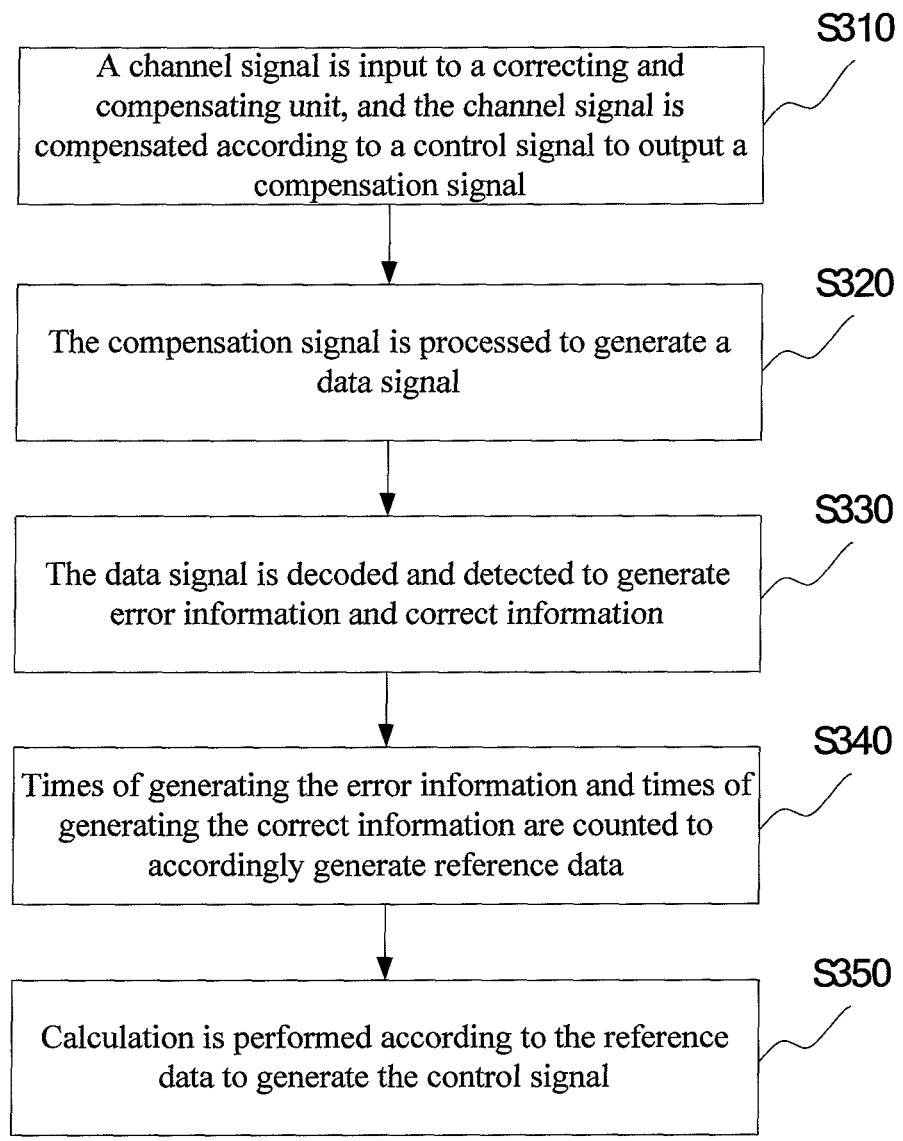
FIG. 8 is a flow chart of a method for compensating impedance and gain of a transmission interface.

Please refer to FIG. 8, which is a flow chart of a method for compensating impedance and gain of a transmission interface. The method includes the following steps.

S310: A channel signal is input to a correcting and compensating unit, and the channel signal is compensated according to a control signal, to output a compensation signal.

S320: The compensation signal is processed to generate a data signal.

S330: The data signal is decoded and detected to generate error information and correct information.

S340: Times of generating the error information and times of generating the correct information are counted to accordingly generate reference data.

S350: Calculation is performed according to the reference data to generate the control signal.

The control signal includes a first control signal and a second control signal, and is respectively used to adjust a correcting impedance and an equalizer. The first control signal and the second control signal are generated according to the reference data by using a look-up table, an impedance value of the correcting impedance is adjusted according to the first control signal, so as to match with an impedance value of the channel, and a compensation parameter of the equalizer is adjusted according to the second control signal, so as to compensate the channel signal and generate the compensation signal.

The reference data includes first reference data and second reference data. The first reference data represents reference data calculated currently, and the second reference data represents reference data calculated previously. The adaptive control unit generates a first control signal and a second control signal according to the first reference data and the second reference data by using an adaptive adjusting manner.

The adaptive adjusting manner for the first control signal is an calculation according to conditions in the following: when the first reference data is smaller than or equal to the second reference data, it is not necessary to invert an impedance symbol, namely, the impedance symbol is adjusted to the same direction, and the first control signal is obtained by summing up the impedance symbol and the previous first control signal multiplies with an impedance step value. When the first reference data is greater than the second reference data, it is necessary to invert the impedance symbol, that is, a positive value of the impedance symbol is changed to a negative value, or the negative value is changed to the positive value, and adjusting is performed to the opposite direction, the first control signal is obtained by summing up the inverted impedance symbol and the previous first control signal multiplies with the impedance step value.

The adaptive adjusting manner for the second control signal is an calculation according to conditions in the following: when the first reference data is smaller than or equal to the second reference data, it is not necessary to invert a gain symbol, that is, the gain symbol is adjusted to the same direction, the second control signal is obtained by summing up the gain symbol and the previous second control signal multiplies with a gain step value; when the first reference data is greater than the second reference data, it is necessary to invert the impedance symbol, that is, a positive value of the gain symbol is changed to a negative value, or the negative value is changed to the positive value, and adjusting is performed to the opposite direction, the second control signal is obtained by summing up the inverted gain symbol and the previous second control signal multiplies with the gain step value.

The reference data is the accumulated times of generating the error information, or is obtained by dividing the accumulated times of generating the error information by a sum of the accumulated times of generating the error information and the accumulated times of generating the correct information.

It should be noted that in the device and the method for compensating the impedance and the gain of the transmission interface according to the disclosure, the calculating unit performs the calculation by using the error information and the correct information output by the decoder, so as to generate the reference data. Furthermore, the adaptive control unit receives the reference data through calculating the reference data to generate the control signal to the correcting and compensating unit, thereby practically solves the problem in the prior art that the impedance cannot be corrected and compensated.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A device for compensating impedance and gain of a transmission interface, coupled to a channel, the device comprising:
 a correcting and compensating unit, coupled to the channel, used to receive a channel signal, and compensating the channel signal according to a control signal to generate a compensation signal;
 a clock data recovering unit, coupled to the correcting and compensating unit, and used to receive the compensation signal and generate a data signal;
 a decoder, coupled to the clock data recovering unit, and used to decode the data signal and perform detection to generate an error information and a correct information;
 a calculating unit, coupled to the decoder, and used to count times of generating the error information and times of generating the correct information to accordingly generate a reference data; and
 an adaptive control unit, coupled to the calculating unit and the correcting and compensating unit, used to receive the reference data and calculate the reference data to generate the control signal to the correcting and compensating unit.

2. The device according to claim 1, wherein the reference data is obtained by dividing accumulated times of generating the error information by a sum of the accumulated times of generating the error information and accumulated times of generating the correct information, and adopts a percentage form.

3. The device according to claim 1, wherein the control signal comprises a first control signal and a second control signal, and the correcting and compensating unit comprises:
a correcting impedance, coupled to the channel and the adaptive control unit, wherein the adaptive control unit adjusts an impedance value of the correcting impedance according to the first control signal, so as to match with an impedance value of the channel; and
an equalizer, coupled to the channel, the adaptive control unit, and the correcting impedance, used to receive the channel signal, and adjusting a compensation parameter of the equalizer according to the control signal to compensate the channel signal.

4. The device according to claim 3, wherein the adaptive control unit generates the first control signal according to the reference data by using a look-up table, and adjusts the impedance value of the correcting impedance according to the first control signal, so as to achieve the impedance matching with the impedance value of the channel.

5. The device according to claim 3, wherein the adaptive control unit generates the second control signal according to the reference data by using a look-up table, and adjusts a compensation parameter of the equalizer according to the second control signal, so as to compensate the channel signal.

6. The device according to claim 3, wherein the reference data comprises a first reference data and a second reference data, the first reference data represents reference data calculated currently, and the second reference data represents reference data calculated previously, and the adaptive control unit generates the first control signal and the second control signal according to the first reference data and the second reference data.

7. The device according to claim 6, wherein when the first reference data is smaller than or equal to the second reference data, the adaptive control unit adds an impedance symbol to the previous first control signal, and multiplies a sum of the impedance symbol and the previous first control signal by an impedance step value, so as to generate the first control signal; when the first reference data is greater than the second reference data, the adaptive control unit adds the inverted impedance symbol to the previous first control signal, and multiplies a sum of the inverted impedance symbol and the previous first control signal by the impedance step value, so as to generate the first control signal.

8. The device according to claim 6, wherein when the first reference data is smaller than or equal to the second reference data, the adaptive control unit adds a gain symbol to the previous second control signal, and multiplies a sum of the gain symbol and the previous second control signal by a gain step value, so as to generate the second control signal; when the first reference data is greater than the second reference data, the adaptive control unit adds the inverted gain symbol to the previous second control signal, and multiplies a sum of the inverted gain symbol and the previous second control signal by the gain step value, so as to generate the second control signal.

9. The device according to claim 1, wherein the correcting and compensating unit comprises:
a correcting impedance, coupled to the channel and the adaptive control unit, wherein the adaptive control unit corrects an impedance value of the correcting impedance according to the control signal, so as to match with an impedance value of the channel; and
an equalizer, coupled to the channel, the adaptive control unit, and the correcting impedance, used to receive the channel signal, and compensating the channel signal to generate the compensation signal.

10. The device according to claim 9, wherein the adaptive control unit generates the control signal according to the reference data by using a look-up table, and adjusts the impedance value of the correcting impedance according to the control signal, so as to achieve the impedance matching with the impedance value of the channel.

11. The device according to claim 9, wherein the reference data comprises first reference data and second reference data, the first reference data represents reference data calculated currently, and the second reference data represents reference data calculated previously, and the adaptive control unit generates the control signal according to the first reference data and the second reference data.

12. The device according to claim 11, wherein when the first reference data is smaller than or equal to the second reference data, the adaptive control unit adds an impedance symbol to the previous control signal, and multiplies a sum of the impedance symbol and the previous control signal by an impedance step value; when the first reference data is greater than the second reference data, the adaptive control unit adds the inverted impedance symbol to the previous control signal, and multiplies a sum of the inverted impedance symbol and the previous control signal by the impedance step value, so as to generate the control signal.

13. The device according to claim 1, wherein the correcting and compensating unit comprises:
a correcting impedance, coupled to the channel, wherein an impedance value of the correcting impedance is used to match with an impedance value of the channel, so as to reduce reflection distortion; and
an equalizer, coupled to the channel, the adaptive control unit, and the correcting impedance, used to receive the channel signal, and compensating the channel signal according to the control signal, so as to output the compensation signal.

14. The device according to claim 13, wherein the adaptive control unit generates the control signal according to the reference data by using a look-up table, and adjusts a compensation parameter of the equalizer according to the control signal, so as to compensate the channel signal.

15. The device according to claim 13, wherein the reference data comprises first reference data and second reference data, the first reference data represents reference data calculated currently, and the second reference data represents reference data calculated previously, and the adaptive control unit generates the control signal according to the first reference data and the second reference data.

16. The device according to claim 15, wherein when the first reference data is smaller than or equal to the second reference data, the adaptive control unit adds a gain symbol to the previous control signal, and multiplies a sum of the gain symbol and the previous control signal by a gain step value, so as to generate the control signal; when the first reference data is greater than the second reference data, the adaptive control unit adds the inverted gain symbol to the previous control signal, and multiplies a sum of the inverted gain symbol and the previous control signal by the gain step value, so as to generate the control signal.

17. A method for compensating impedance and gain of a transmission interface, comprising:
inputting a channel signal to a correcting and compensating unit, and compensating the channel signal according to a control signal, so as to output a compensation signal;

processing the compensation signal to generate a data signal;

decoding and detecting the data signal, so as to generate an error information and a correct information;

counting times of generating the error information and times of generating the correct information, so as to accordingly generate a reference data; and performing calculation according to the reference data, so as to generate the control signal.

18. The method according to claim 17, wherein the control signal comprises a first control signal and a second control signal, the first control signal and the second control signal are generated according to the reference data by using a look-up table, an impedance value of a correcting impedance is adjusted according to the first control signal, so as to match with an impedance value of the channel, and a compensation parameter of an equalizer is adjusted according to the second control signal, so as to compensate the channel signal.

19. The method according to claim 17, wherein the reference data comprises first reference data and second reference data, the first reference data represents reference data calculated currently, and the second reference data represents reference data calculated previously, and an adaptive control unit generates a first control signal and a second control signal according to the first reference data and the second reference data by using an adaptive adjusting manner.

20. The method according to claim 19, wherein the adaptive adjusting manner is an calculation according to conditions in the following: when the first reference data is smaller than or equal to the second reference data, an impedance symbol is added to the previous first control signal, and a sum of the impedance symbol and the previous first control signal is multiplied by an impedance step value, so as to generate the second control signal; when the first reference data is greater than the second reference data, the inverted impedance symbol is added to the previous first control signal, and a sum of the inverted impedance symbol and the previous first control signal is multiplied by the impedance step value, so as to generate the first control signal.

\* \* \* \* \*